(12) United States Patent
Haberecht

(10) Patent No.: US 10,982,324 B2
(45) Date of Patent: Apr. 20, 2021

(54) METHOD AND DEVICE FOR PRODUCING COATED SEMICONDUCTOR WAFERS

(71) Applicant: SILTRONIC AG, Munich (DE)

(72) Inventor: Joerg Haberecht, Freiberg (DE)

(73) Assignee: Siltronic AG, Munich (DE)

( * ) Notice: Subject to any disclaimer, the term of this patent is extended or adjusted under 35 U.S.C. 154(b) by 186 days.

(21) Appl. No.: 16/304,222

(22) PCT Filed: Jun. 13, 2017

(86) PCT No.: PCT/EP2017/064383
§ 371 (c)(1),
(2) Date: Nov. 23, 2018

(87) PCT Pub. No.: WO2018/001720
PCT Pub. Date: Jan. 4, 2018

(65) Prior Publication Data
US 2020/0318234 A1   Oct. 8, 2020

(30) Foreign Application Priority Data

Jun. 28, 2016 (DE) ...................... 10 2016 211 614.2

(51) Int. Cl.
*H01L 21/20* (2006.01)
*C23C 16/44* (2006.01)
(Continued)

(52) U.S. Cl.
CPC ...... *C23C 16/4405* (2013.01); *C23C 16/4558* (2013.01); *C23C 16/45574* (2013.01); *H01L 21/0262* (2013.01)

(58) Field of Classification Search
CPC .......... H01L 21/0262; H01L 21/67386; C23C 16/4405; C23C 16/45574; C23C 16/4558;
(Continued)

(56) References Cited

U.S. PATENT DOCUMENTS 5,551,982 A    9/1996  Anderson et al.
6,001,175 A *  12/1999 Maruyama .............. C30B 25/10
                                                      117/102
(Continued)

FOREIGN PATENT DOCUMENTS

DE    695 34 965 T2    1/2007
JP    H0562912 A       3/1993
(Continued)

*Primary Examiner* — Brook Kebede
(74) *Attorney, Agent, or Firm* — Brooks Kushman P.C.

(57) ABSTRACT

Coated semiconductor wafers are produced by introducing a process gas through first gas inlet openings along a first flow direction into a reactor chamber and over a substrate wafer of semiconductor material lying on a susceptor in order to deposit a layer on the substrate wafer, whereby material derived from the process gas precipitates on a preheat ring arranged around the susceptor; extracting the coated substrate wafer from the reactor chamber; and subsequently removing material precipitate from the preheat ring by introducing an etching gas through the first gas inlet openings into the reactor chamber along the first flow direction over the preheat ring and also through second gas inlet openings between which the first gas inlet openings are arranged, along further flow directions which intersect with the first flow direction.

4 Claims, 2 Drawing Sheets

(51) Int. Cl.
*C23C 16/455* (2006.01)
*H01L 21/02* (2006.01)

(58) Field of Classification Search
CPC ............ C23C 16/4584; C23C 16/4585; C23C 16/4586; C23C 16/4587
USPC ........................................................ 438/478
See application file for complete search history.

(56) References Cited

U.S. PATENT DOCUMENTS

| | | | | |
|---|---|---|---|---|
| 6,099,648 | A | * | 8/2000 | Anderson ............... C30B 25/08 118/715 |
| 6,245,149 | B1 | | 6/2001 | de Lomenie et al. |
| 2002/0173164 | A1 | | 11/2002 | Raffin et al. |
| 2010/0029066 | A1 | * | 2/2010 | Miyashita ........... C23C 16/4584 438/478 |
| 2014/0137801 | A1 | | 5/2014 | Lau et al. |
| 2014/0326185 | A1 | | 11/2014 | Lau et al. |
| 2015/0368796 | A1 | | 12/2015 | Li et al. |

FOREIGN PATENT DOCUMENTS

| | | |
|---|---|---|
| JP | H11329975 A | 11/1999 |
| KR | 1020110104594 A | 9/2011 |

* cited by examiner

METHOD AND DEVICE FOR PRODUCING COATED SEMICONDUCTOR WAFERS

CROSS REFERENCE TO RELATED APPLICATIONS

This application is the U.S. National Phase of PCT Appln. No. PCT/EP2017/064383 filed Jun. 13, 2017, which claims priority to German Application No. 10 2016 211 614.2 filed Jun. 28, 2016, the disclosures of which are incorporated in their entirety by reference herein.

BACKGROUND OF THE INVENTION

1. Field of the Invention

The invention relates to a method for producing coated semiconductor wafers, preferably semiconductor wafers having an epitaxial layer, and to a device for carrying out the method.

2. Description of the Related Art

The production of semiconductor wafers often involves deposition of a layer on a substrate wafer in a reactor chamber, in which substrate wafers are coated individually by means of vapor deposition (CVD). Such a reactor chamber comprises liners and an upper and a lower cover, which are also referred to as the upper and lower dome. During the deposition of a layer, the substrate wafer lies on a susceptor and is heated by radiation from upper and lower lamp arrays, which are arranged above and below the upper and lower domes. A process gas is fed by means of a gas injector through gas inlet openings into the reactor chamber and over the substrate wafer, the process gas being decomposed and partially deposited as a material layer on the surface of the substrate wafer exposed to the process gas. Furthermore, material may also be precipitated inside the reactor chamber, particularly on a preheat ring which encloses the susceptor. Such a material precipitate, which is not intended, must be eliminated at particular time intervals by a cleaning process. This is usually done by a so-called chamber etch, by feeding an etching gas which reacts with the material precipitate to form gaseous reaction products through the gas inlet openings into the reactor chamber instead of the process gas. The reaction products are subsequently removed from the reactor chamber through a gas outlet.

US 2015/0 368 796 A1 describes a gas injector which is used in an epitaxy reactor. It supplies first and second gas inlet openings successively or simultaneously with a process gas and an etching gas, in order to carry out a selective epitaxial process to improve the deposition of an epitaxial layer.

U.S. Pat. No. 6,245,149 discloses a device and a method for coating a substrate wafer with an epitaxial layer, for example an epitaxial layer of silicon. The method also involves a chamber etch by means of hydrogen chloride as an etching gas.

A chamber etch entails a productivity loss, since the coating of substrate wafers has to be interrupted because of it. Owing to the position of the preheat ring in immediate proximity to the susceptor, the unintended material precipitation is greatest on the preheat ring. The duration of a chamber etch is therefore essentially dictated by the time which is required to remove a material precipitate with a particular thickness from the preheat ring.

It is an object of the invention to make this time as short as possible.

SUMMARY OF THE INVENTION

The object of the invention is achieved by a method for producing coated semiconductor wafers, comprising introduction of a process gas through first gas inlet openings along a first flow direction into a reactor chamber and over a substrate wafer of semiconductor material in order to deposit a layer on the substrate wafer, which lies on a susceptor, wherein material that comes from the process gas is precipitated on a preheat ring, which is arranged around the susceptor; and extraction of the coated substrate wafer from the reactor chamber;

characterized by, after extraction of the coated substrate wafer from the reactor chamber: removal of the material precipitate from the preheat ring by introducing an etching gas through the first gas inlet openings into the reactor chamber along the first flow direction and through second gas inlet openings, between which the first gas inlet openings are arranged, over the preheat ring along further flow directions which intersect with the first flow direction.

DETAILED DESCRIPTION OF THE PREFERRED EMBODIMENTS

Figure 1:
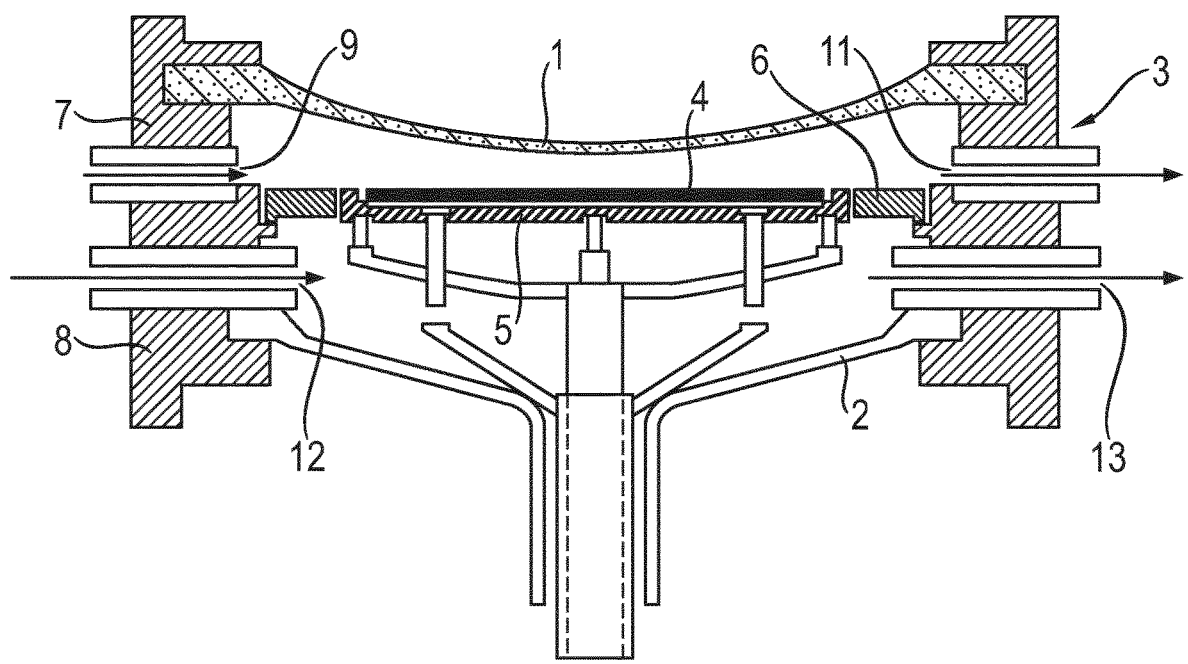
FIG. 1 shows a device for depositing a layer on a substrate wafer suitable for carrying out the invention.

The invention provides removal of material precipitate on the preheat ring in the course of a chamber etch, and in this case feeding of etching gas additionally through second gas inlet openings, which are provided for this purpose. The second gas inlet openings are of no importance in connection with the processing of a substrate wafer, neither in connection with the coating of a substrate wafer nor in connection with the etching of a substrate wafer. The second gas inlet openings are thus in use only during removal of the material precipitate from the preheat ring.

Etching gas which flows out of the first gas inlet openings during the removal of the material precipitate from the preheat ring has a flow direction in the direction of the gas outlet. The etching gas flow generated in this way has a width, transverse to this flow direction, which is not greater than the length of the internal diameter of the preheat ring. This is related to the actual purpose of the first gas inlet openings: the gas flow which is fed through the first gas inlet openings into the reaction is used primarily to process a substrate wafer, irrespective of whether the processing involves passing process gas and/or etching gas through. In order to fully cover the substrate wafer, the gas flow generated must move in a corridor whose width is not less than the diameter of the substrate wafer. The corridor will, however, also not be substantially wider than the diameter of the substrate wafer, in order to restrict the effect of the gas fed through to the substrate wafer to be processed.

The inventor of the present invention has found that the removal of a material precipitate from the preheat ring by introducing an etching gas through the first gas inlet openings is not particularly effective.

The invention remedies this by providing second gas inlet openings between which the first gas inlet openings are arranged and through which etching gas is fed additionally and along further flow directions, which are directed at the material precipitate on the preheat ring. The consequence of this measure is that removal of material precipitate from the preheat ring can be completed in a shorter time. The time saving is considerable.

The removal of the material precipitate from the preheat ring involves, after extraction of the coated substrate wafer from the reactor chamber, introduction of an etching gas into the reactor chamber through first gas inlet openings along a first flow direction and through second gas inlet openings along further flow directions. The first flow direction is directed, starting from the first gas inlet openings, toward the gas outlet of the reactor chamber. The etching gas flows out of the first gas inlet openings in the form of an etching gas flow whose width, transverse to the first flow direction, is not wider than the internal diameter of the preheat ring.

In addition, etching gas is fed through the second gas inlet openings into the reactor chamber along the further flow directions which intersect with the first flow direction. The further flow directions therefore have a direction component which is directed perpendicularly to the first flow direction.

The choice of the substrate wafer of semiconductor material is in principle not subject to any restrictions. Preferably, a substrate wafer is selected which contains monocrystalline semiconductor material to be coated, for example a semiconductor wafer of monocrystalline silicon, an SOI (silicon on insulator) wafer, or a bonded semiconductor wafer. Instead of silicon, the semiconductor material to be coated may be another semiconductor or a compound semiconductor, for example SiGe or a III/V compound semiconductor.

Likewise, there are in principle no restrictions in relation to the choice of the layer to be deposited. It preferably consists of polycrystalline or monocrystalline silicon or of a monocrystalline compound semiconductor, for example SiGe or a III/V compound semiconductor. It is particularly preferred to deposit an epitaxial layer of monocrystalline silicon on the substrate wafer of semiconductor material.

In relation to the choice of the etching gas, there are likewise no particular restrictions. In the case of depositing a layer which contains silicon or consists of silicon, an etching gas which contains hydrogen chloride or consists of hydrogen chloride is preferably used.

After the coating, the coated substrate wafer is extracted from the reactor chamber and the material precipitate starts to be removed from the preheat ring, or a further substrate wafer starts to be coated in the reactor chamber. Preferably, a plurality of substrate wafers of semiconductor material are coated successively before the removal of the material precipitate from the preheat ring is started. If the substrate wafer of semiconductor material is coated with a layer which contains silicon or consists of silicon, the removal of the material precipitate from the preheat ring is preferably not started until after the material precipitate on the preheat ring has reached a minimum thickness of 50 μm. Allowing more than 70 μm of such material precipitate to grow before the removal of the material precipitate from the preheat ring is started should be avoided.

Before the removal of the material precipitate from the preheat ring, a dummy wafer may be placed on the susceptor in order to protect the surface of the susceptor. This measure, however, is not absolutely necessary.

The invention furthermore relates to a device for depositing a layer on a substrate wafer, comprising a reactor chamber having liners, and having an upper and a lower cover;

a susceptor for holding a substrate wafer;

a preheat ring, which encloses the susceptor;

first gas inlet openings for introducing gas into the reactor chamber and over the susceptor along a first flow direction; and second gas inlet openings, between which the first gas inlet openings are arranged, for introducing etching gas into the reactor chamber and over the preheat ring along further flow directions which intersect with the first flow direction.

Preferably, the second gas inlet openings are arranged axisymmetrically with respect to the first flow direction as a symmetry axis and concentrically with the circumference of the preheat ring along a first and a second circle arc. The first and second circle arcs respectively preferably have a length which is determined by an angle at the center a of not less than 70° and not more than 100°.

Preferably, a number of from 15 to 20 second gas inlet openings are respectively arranged equally distributed along the first and second circle arcs. The second gas inlet openings preferably have a round cross section, preferably with a diameter of from 5 mm to 7 mm.

The first and/or the second gas inlet openings may be subdivided into one or more groups.

A gas injector feeds gas to the first and second gas inlet openings, namely process gas to the first gas inlet openings during the coating of a substrate wafer and etching gas to the first and second gas inlet openings during the removal of a material precipitate from the preheat ring. The gas injector is preferably configured in such a way that at least the first and second gas inlet openings can be controlled independently of one another, i.e. gas supplies differing from one another in relation to the type and/or temperature and/or pressure and/or flow rate of the supplied gas are respectively possible. In the case of subdivision of the first and/or second gas inlet openings into groups, such a possibility of independent control of the respective groups may likewise be provided.

The features specified in relation to the embodiments of the method according to the invention which are described above may be applied correspondingly to the device according to the invention. Conversely, the features specified in relation to the embodiments of the device according to the invention which are described above may be applied correspondingly to the method according to the invention. These and other features of the embodiments according to the invention will be explained in the description of the figures and in the claims. The individual features may be implemented either separately or in combination as embodiments of the invention. Furthermore, they may describe advantageous embodiments which are protectable independently.

The invention will be described below with reference to the drawings.

LIST OF REFERENCES USED 1 upper cover
2 lower cover
3 reactor chamber
4 substrate wafer
5 susceptor
6 preheat ring
7 upper liner
8 lower liner 9 first gas inlet openings
10 second gas inlet openings
11 first gas outlet
12 lower gas inlet openings
13 second gas outlet The device represented in FIG. 1 for depositing a layer on a substrate wafer comprises a reactor chamber 3 having an upper cover 1 and a lower cover 2, and upper and lower liners 7 and 8 which enclose a reaction space. Upper and lower lamp arrays lying outside the reactor chamber 3 are not represented.

A substrate wafer 4 is placed on a susceptor 5, supported rotatably from below by arms of a carrier. The substrate wafer 4 may be placed on the susceptor 5, and lifted again from the susceptor 5 after the coating, by means of lifting pins which are passed through the susceptor 5.

During coating of the substrate wafer 4, process gas is fed into the reactor chamber 3 through first gas inlet openings 9, which are provided in the upper liner 7, along a first flow direction over the substrate wafer to a first gas outlet 11. Furthermore, lower gas inlet openings 12 and a second gas outlet 13 may optionally be provided, in order to feed a flushing gas below the susceptor 5 to the second gas outlet 13.

Figure 2:
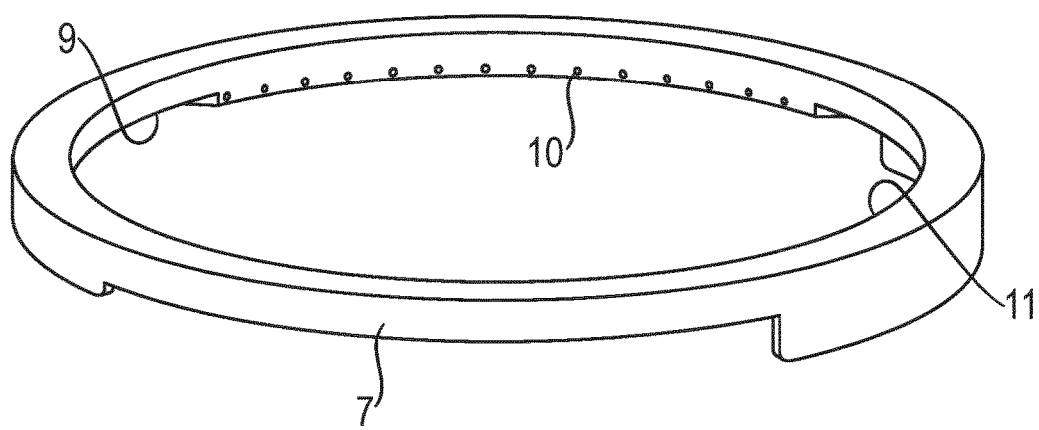
FIG. 2 shows features, according to the invention, of the device in perspective representation.

The upper liner 7 is represented in perspective in FIG. 2. Besides the first gas inlet openings 9, second gas inlet openings 10 are provided. Etching gas, which is fed into the reactor chamber through the first and second gas inlet openings 9 and 10 in order to remove the material precipitate from the preheat ring, leaves the reactor chamber through the first gas outlet 11.

Figure 3:
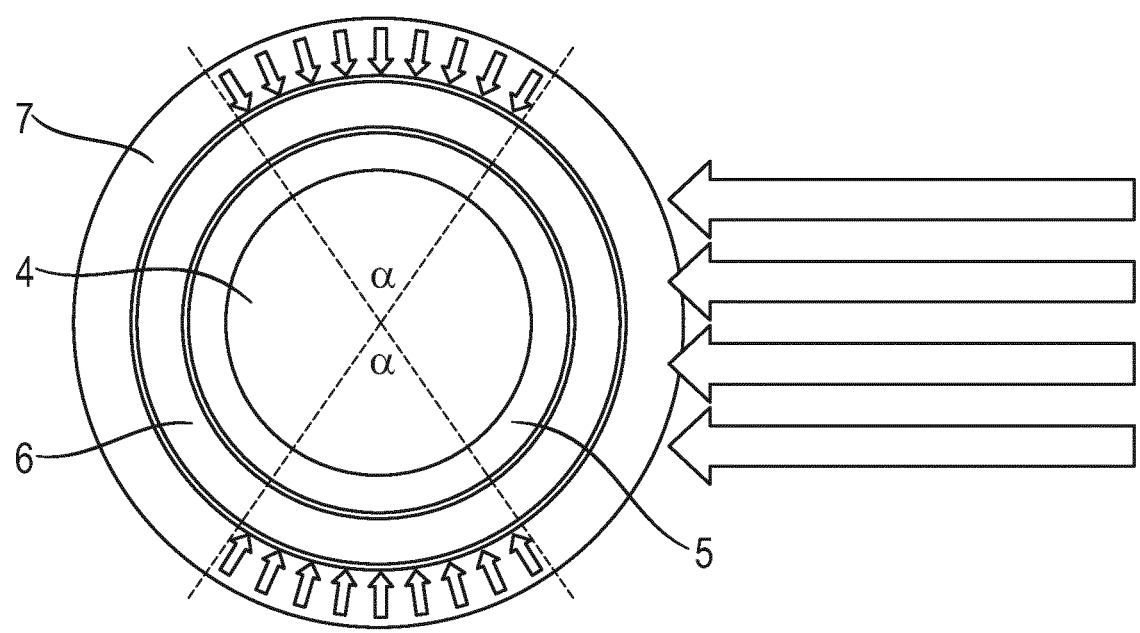
FIG. 3 shows features, according to the invention, of the device from above.

FIG. 3 shows from above an arrangement comprising the upper liner 7 according to FIG. 2, the preheat ring 6, the susceptor 5 and the substrate wafer 4. During the deposition of a layer on the substrate wafer 4, process gas flows along the first flow direction, which is symbolized by long arrows, over the substrate wafer 4 to the first gas outlet. The width of the process gas flow which leaves the first gas inlet openings 9 is preferably greater than the diameter of the substrate wafer and not greater than the internal diameter of the preheat ring. A gas injector which is provided for independent supplying of gas to the first and second gas inlet openings 9 and 10 is not represented. During the deposition of a layer on the substrate wafer 4, no gas is fed through the second gas inlet openings.

The short arrows symbolize further flow directions, along which an etching gas flows, this gas being fed through the second gas inlet openings 10 over the preheat ring 6 along the further flow directions in order to remove a material precipitate from the preheat ring 6 after extraction of the coated substrate wafer 4 from the reactor chamber. At the same time, etching gas is introduced into the reactor chamber through the first gas inlet openings along the first flow direction. The width of the etching gas flow introduced through the first gas inlet openings preferably corresponds to the width of the process gas flow. The further flow directions intersect with the first flow direction and therefore respectively have a direction component perpendicular to the first flow direction.

Example

The invention has been tested in practice. An epitaxial layer of silicon was deposited on substrate wafers of silicon. By using the method according to the invention, it was possible to shorten the time taken to remove the material precipitate from the preheat ring by up to 40%, compared with a method in which only the first gas inlet openings were in use during the removal of the material precipitate from the preheat ring.

The above description of exemplary embodiments is to be understood by way of example. The disclosure thereby made on the one hand allows the person skilled in the art to understand the present invention and the advantages associated therewith, and on the other hand also includes changes and modifications to the described structures and methods which are obvious within the understanding of the person skilled in the art. All such changes and modifications, as well as equivalents, are therefore intended to be covered by the protective scope of the claims.

The invention claimed is:

1. A method for producing coated semiconductor wafers, comprising:
    introducing a process gas through first gas inlet openings into a reactor chamber along a first flow direction and over a substrate wafer of semiconductor material lying on a susceptor, and
    depositing a layer on the substrate wafer to produce a coated substrate wafer, wherein material precipitate derived from the process gas precipitates on a preheat ring arranged around the susceptor;
    extracting the coated substrate wafer from the reactor chamber; and
    following extracting the coated substrate wafer from the reactor chamber, removing material precipitate from the preheat ring by introducing an etching gas over the preheat ring through the first gas inlet openings into the reactor chamber along the first flow direction and also through second gas inlet openings, between which the first gas inlet openings are arranged, and which provides further flow directions for etching gas which intersect with the first flow direction.

2. The method of claim 1, further comprising, before introducing the etching gas into the reactor chamber, repeating the deposition of a layer on a further substrate wafer of semiconductor material and extracting a further coated substrate wafer from the reactor chamber, and optionally repeating the steps with yet further substrate wafers until the material precipitate on the preheat ring has reached a minimum set thickness.

3. The method of claim 2, wherein the etching gas contains hydrogen chloride, and the material precipitate on the preheat ring contains silicon, and has a minimum thickness of 50 μm prior to its removal from the preheat ring.

4. The method of claim 1, wherein the step of depositing a layer on a substrate wafer comprises depositing an epitaxial layer of silicon on the substrate wafer.

* * * * *